United States Patent
Mohta et al.

(10) Patent No.: US 11,515,883 B2
(45) Date of Patent: Nov. 29, 2022

(54) CONFIGURATION OF ADC DATA RATES ACROSS MULTIPLE PHYSICAL CHANNELS

(71) Applicant: AyDeeKay LLC, Aliso Viejo, CA (US)

(72) Inventors: Setu Mohta, Aliso Viejo, CA (US); Christopher A. Menkus, Aliso Viejo, CA (US); David Kang, Aliso Viejo, CA (US)

(73) Assignee: AyDeeKay LLC, Aliso Viejo, CA (US)

( * ) Notice: Subject to any disclaimer, the term of this patent is extended or adjusted under 35 U.S.C. 154(b) by 0 days.

(21) Appl. No.: 17/322,866

(22) Filed: May 17, 2021

(65) Prior Publication Data

US 2022/0166440 A1 May 26, 2022

Related U.S. Application Data (60) Provisional application No. 63/116,581, filed on Nov. 20, 2020.

(51) Int. Cl.
*H03M 1/12* (2006.01)
*H03M 1/30* (2006.01)

(52) U.S. Cl.
CPC ......... *H03M 1/1225* (2013.01); *H03M 1/123* (2013.01); *H03M 1/303* (2013.01)

(58) Field of Classification Search
CPC ..... H03M 1/1225; H03M 1/123; H03M 1/303
See application file for complete search history.

(56) References Cited

U.S. PATENT DOCUMENTS

| | | | |
|---|---|---|---|
| 8,092,094 B2 | 1/2012 | Meier et al. | |
| 8,519,875 B2 | 8/2013 | Straayer et al. | |
| 9,250,313 B2 | 2/2016 | Lapat et al. | |
| 9,264,059 B2 | 2/2016 | Tousi et al. | |
| 9,270,291 B1 | 2/2016 | Parnaby et al. | |
| 9,319,058 B1* | 4/2016 | Yu ....................... | H03M 1/1038 |
| 9,503,115 B1 | 11/2016 | Shin et al. | |
| 9,571,115 B1* | 2/2017 | Beukema ............ | H03M 1/1023 |
| 9,935,810 B1* | 4/2018 | Hammler ............. | H03F 1/3247 |
| 10,720,936 B1 | 7/2020 | Xu | |
| 2009/0201181 A1 | 8/2009 | Wegener | |
| 2011/0128175 A1* | 6/2011 | Harris ................. | H03M 1/0836 341/155 |
| 2019/0173481 A1 | 6/2019 | Ali et al. | |

OTHER PUBLICATIONS

International Search Report and Written Opinion, PCT application serial No. PCT/US21/59431, dated Feb. 4, 2022.

* cited by examiner

*Primary Examiner* — Lam T Mai (74) *Attorney, Agent, or Firm* — Steven Stupp (57) ABSTRACT

An integrated circuit includes a set of N unit analog-to-digital converters (ADCs) having a common architecture, and which provide an aggregate data rate. Moreover, the integrated circuit includes control logic that selects subsets of the set of N unit ADCs in order to realize sub-ADCs of different data rates that can each be an arbitrary integer multiple of an inverse of N times the aggregate data rate of the N unit ADCs. Furthermore, the control logic may dynamically select the subsets on the fly or on a frame-by-frame basis. This dynamically selection may occur at boot time and/or a runtime. Additionally, the given different data rate may correspond to one or more phases of a multi-phase clock in the integrated circuit, where the multiphase clock may include a number of phases corresponding to a number of possible subsets, and given selected subsets may not use all of the available phases.

20 Claims, 6 Drawing Sheets

CONFIGURATION OF ADC DATA RATES ACROSS MULTIPLE PHYSICAL CHANNELS

CROSS REFERENCE TO RELATED APPLICATIONS

This application claims priority under 35 U.S.C. 119(e) to U.S. Provisional Application Ser. No. 63/116,581, entitled "Configuration of ADC Data Rates Across Multiple Physical Channels," by Setu Mohta, et al., filed on Nov. 20, 2020, the contents of both of which are herein incorporated by reference.

FIELD

The present disclosure relates to an analog-to-digital converter (ADC) that includes a set of unit ADCs that are dynamically configurable into subsets having different, arbitrary data rates.

BACKGROUND

Many existing systems improve ADC resolution by averaging multiple ADC samples at the expense of reducing the ADC data rate. However, in some existing systems runtime allocation of a particular ADC aggregate data rate is required across a variable number of physical input channels. Existing ADCs typically deal with this problem by round-robin sampling of a subset of the physical input channels. This time-division multiple access reduces the allocated data rate for any one channel.

However, this approach often has drawbacks. Notably, the physical channels are typically not simultaneously sampled. Moreover, the rapid disconnection and reconnection of such a high data-rate ADC to each physical input in order to generate each subsequent sample inherently introduces settling time errors and cross-talk between the channels.

Therefore, it is desirable to have an ADC architecture that overcomes the aforementioned limitations, and that provides a flexible tradeoff between sampling rate and the number of physical ADC channels, without compromising the ADC resolution (or the effective number of bits or ENOB) at the per-channel data rate. Such an implementation is useful for active-ranging receiver systems.

In some systems, fine spatial resolution (e.g., in XY) requires a large number of physical input channels. However, a lower ADC sampling rate per spatial channel can be tolerated. Alternatively, in other systems, high range resolution (Z) requires a high ADC sampling rate on a smaller number of physical channels. In return, coarser spatial sampling (e.g., in XY) is acceptable.

Furthermore, in adaptive-ranging systems, it is often desirable to perform an initial scan that maximizes the spatial sampling at the cost of range resolution. This is followed by a zoom in using a higher data rate ADC sampling on a selected subset of the physical channels. However, these capabilities often increase the overall system cost, power and complexity.

SUMMARY

Embodiments of an ADC are described. This ADC includes a set of N unit ADCs, where a given ADC in the set of N unit ADCs has a common architecture, and the set of N unit ADCs provide an aggregate data rate. Moreover, the ADC includes control logic coupled to the set of N unit ADCs. During operation, the control logic selects subsets of the set of N unit ADCs having different data rates from the aggregate data rate, where a given data rate of a given subset comprises a variable data rate that corresponds to a non-zero integer multiple of an inverse of N times the aggregate data rate.

Note that the set of N unit ADCs may include time-interleaved ADCs.

Moreover, the subsets may have common sampling times.

Furthermore, the control logic may dynamically select the subsets. For example, the control logic may dynamically select the subsets on a frame-by-frame basis. Additionally, the control logic may dynamically select the subsets based at least in part on at least a portion of a frame that is identified as meeting a predefined criterion or having a predefined characteristic. In some embodiments, the control logic may dynamically select the subsets at a boot time or a runtime of the ADC.

Moreover, the ADC may include a multi-phase clock having phases corresponding to a number of possible subsets, where the given subset uses one or more of the phases of the multi-phase clock, and the selected subsets do not use all of the phases. Note that the control logic may select the one or more of the phases for the given subset. Furthermore, a number of phases may be greater than a number of ADCs in the set of N unit ADCs. Additionally, the number of phases may be a least common multiple of the number of ADCs in the set of N unit ADCs and numbers of ADCs in each of the subsets.

In some embodiments, the subsets may include different numbers of ADCs and at least two of the subsets may have different data rates from each other.

Note that, while the subsets have arbitrary numbers of ADCs, the control logic may use predefined assignments of ADCs to the subsets. For example, the predefined assignments may be based at least in part on desired sampling times of the subsets.

Moreover, the subsets may have different sampling times.

Furthermore, the given subset may include ADCs that perform quadrature measurements of an input signal using common sampling times that are equally spaced from each other.

Additionally, the control logic may include: memory storing program instructions; and a processor, coupled to the memory, that executes the program instructions. When executed by the processor, the program instructions cause the ADC to perform the selecting.

Another embodiment provides an integrated circuit that includes the ADC.

Another embodiment provides an electronic device that includes the ADC.

Another embodiment provides a method for selecting one or more subsets of a set of N unit ADCs. This method includes at least some of the operations performed by the ADC.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An ADC is described. This ADC includes a set of N unit ADCs, where a given ADC in the set of N unit ADCs has a common architecture, and the set of N unit ADCs provide an aggregate data rate. Moreover, the ADC includes control logic coupled to the set of N unit ADCs. During operation, the control logic selects subsets of the set of N unit ADCs having different data rates from the aggregate data rate, where a given data rate of a given subset comprises a variable data rate that corresponds to a non-zero integer multiple of an inverse of N times the aggregate data rate.

By providing an ADC with reconfigurable ADC hardware, these circuit techniques may enable a variety of use case and may reduce the overall system cost, power and/or complexity. For example, the circuit techniques may allow an ADC data rate or the configuration to be changed based at least in part on detected activity in at least a subset of channels. Alternatively, a controller or a supervisor (or operator) may be requested to change the ADC data rate and/or the configuration. Thus, the controller or the supervisor may change to the configuration based at least in part on past history or an expected data-rate requirement. Moreover, the circuit techniques may address an initial divider-reset problem for the set of N unit ADCs, so it can be known, with certainty, which unit ADCs are associated with which physical channel. Thus, while the circuit techniques allow arbitrary subsets to be selected, in some embodiments the assignments of the unit ADCs to particular subset(s) that are associated with particular physical channel(s) may be predefined. Furthermore, the circuit techniques may allow a simultaneous sampling requirement to be relaxed to a 'known and fixed' relative sampling requirement in order to simplify the implementation and/or to determine what can be gained, such as decoupling multiphase clocking and a switch matrix in the ADC. Additionally, the circuit techniques may allow a K-throw switch matrix to be implemented for small prime numbers K that preserve high-analog bandwidth on the physical input channel even if the data rate is changed, e.g., with reduced or minimal capacitive loading. In some embodiments, the circuit techniques may facilitate unequal data-rate ADCs (as opposed to using 'divide-by-2' approach). One or more of these capabilities may allow the ADC to be used in a wide variety of systems, electronic devices and applications.

Figure 1:
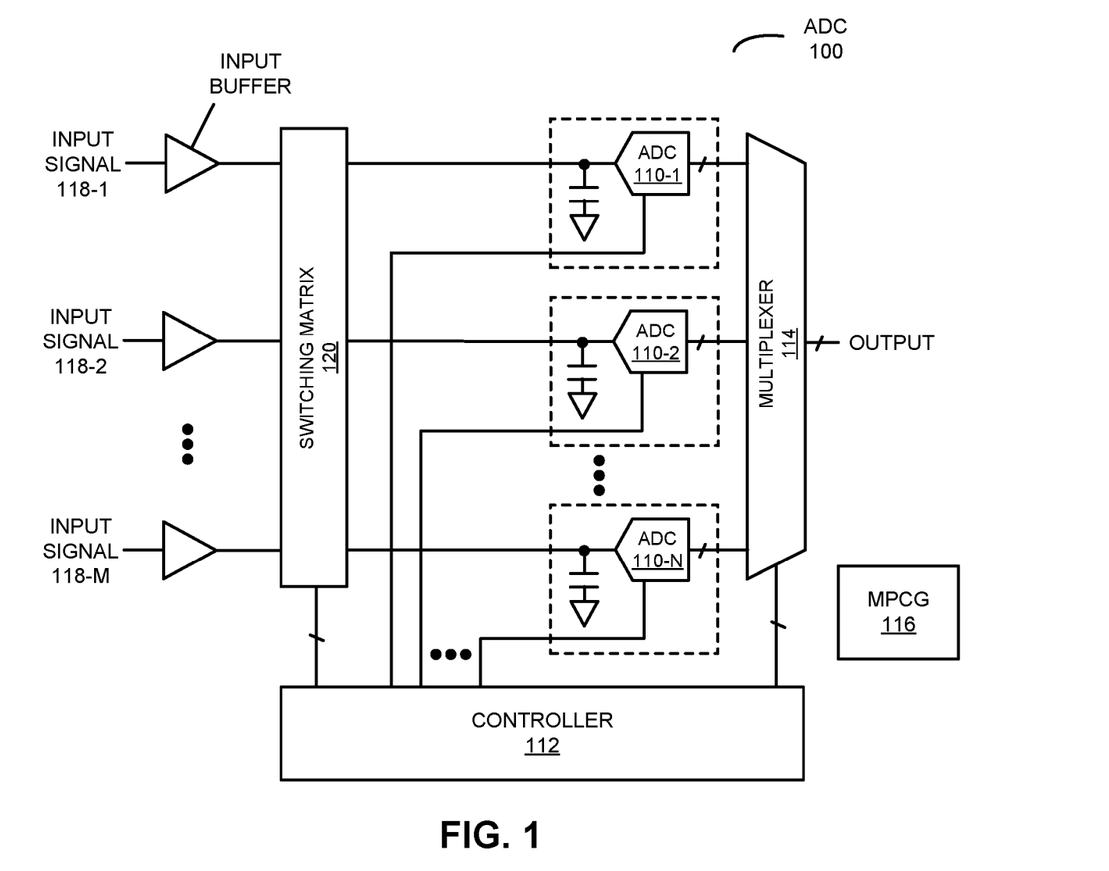
FIG. 1 is a block diagram illustrating an example of analog-to-digital converter (ADC) that includes a set of N unit ADCs according to some embodiments of the present disclosure.

We now describe embodiments of the ADC. FIG. 1 presents an example of an ADC 100 with a set of N unit ADCs 110. Notably, in FIG. 1, at any given sampling time, a subset of the set of N unit ADCs 110 (where N is a non-zero integer) are processing samples of one or more input signals 118 and a remainder of the set of N unit ADCs 110 are available for processing at a subsequent sampling time. In some embodiments, controller 112 or control logic implements a decision technique that is used to select among the set of N unit ADCs 110. For example, controller 112 may configure a switching matrix 120 to route input signals 118 (where M is a non-zero integer) to the subset of the set of N unit ADCs 110. Note that switching matrix 120 may selectively couple a given input signal to zero or more of the set of N unit ADCs 110. Moreover, a multiplexer 114 in ADC 100 may combine output samples from the subset of the set of N unit ADCs 110 to provide an output. Furthermore, the ADC 100 may include a multi-phase clock generator (MPCG) 116 having phases corresponding to a number of possible subsets, and which may provide clock signals having associated phases to the subset of the set of N unit ADCs 110 based at least in part on instructions from the controller 112. Note that the set of N unit ADCs 110 may include time-interleaved ADCs. In some embodiments, the set of N unit ADCs 110 may include one or more ADC architectures, including: flash, binary successive approximation, and/or pipeline.

For example, the set of N unit ADCs 110 may each have a data rate R, which can be divided into L disjoint subsets whose sizes are $M_1, M_2, \ldots M_i, M_{i+1}, \ldots, M_L$, such that $\Sigma_{i=1}^{L} M_i = N$ for non-negative integer values of $M_i$. With appropriate switch configuration, each of these L subsets time-interleaves its $M_i$ unit ADCs to achieve a data rate of $R \cdot M_i$ for the $i^{th}$ channel. The choice of L and the assigned subset $\{M_i\}$ may be configured by controller 112 using software and/or hardware.

In some embodiments, $M_1 = M_2 = \ldots = M_i = \ldots M_L = K$, so that $N = K \cdot L$, resulting in (N/K) ADC channels that each possess a data rate of $K \cdot R$. This arrangement may be facilitated by choosing N to have many positive integer factors. For example, for N=4, appropriate switch configuration in ADC 100 allows the creation of a one time-interleaved ADC with a data rate of 4R, or two time-interleaved ADCs that each have a data rate of 2R, or four ADCs independently operating with the original data rate R. Similarly, for N=6, additional possibilities are available, where the choices are a single ADC with a data rate of 6R, two ADCs that each have a data rate of 3R, three ADCs that each have a data rate of 2R, or six independent ADCs independently operating with the original data rate R. In general, N=2a results can be realized (where a is an integer) as a nested binary (or nested 4-way) switch tree, but other configurations for $N=2^a \cdot 3^b \cdot 5^c$ . . . (where b and c are the same of different integers from a) and so forth are possible within practical limitations on the switch matrix and sample-and-hold design.

In other embodiments, the sizes of the L subsets are unequal, even though the sum of their sizes remains N. Note that the size of a given subset $M_1$ can be 0. This configuration can provide unequal data-rate allocation across a multiplicity (L) of physical channels. For example, it may be desirable for controller 112 to reconfigure the data rate using software depending on environmental conditions or the use-case specifications (e.g., the resolution) in a manner similar to how the eye maintains low-resolution peripheral vision over a wide field of view, while still providing high-resolution vision at the center of the field of view. Thus, the resolution of at least at least one of the subsets of the set of N unit ADCs 110 may be dynamically adapted based at least in part on at least a portion of a prior different resolution frame or image. The disclosed embodiments allow the 'center' to be chosen electronically, without mechanical movement. Alternatively, more numerous low data rate unit ADCs may be used to poll the input channels waiting for signals of interest, and then controller 112 may make a decision to immediately increase the data rate on a subset of the input channels using the remaining unit ADCs once a signal of interest has been discovered. In this way, the majority of the unit ADCs may be used at all times, whether for polling multiple distinct physical input channels, or as part of a higher data-rate ADC looking at a given physical input channel.

Notably, for N=4, controller 112 may choose L=2, $M_1$=1 and $M_2$=3 to provide two unit ADCs having data rates of R and 3R. As another example, starting from a configuration with N=L=4 (i.e., four ADCs, each with a data rate of R, polling four channels), when a signal of interest is discovered on channel 1, controller 112 may allocate a date rate of 3R to that channel, while allowing the fourth unit ADC with a data rate of R to operate in round-robin mode across the remaining three channels. If a second signal of greater interest is now discovered on (say) channel 3, the controller 112 may reallocate the total data rate to now have data rates of 2R and 2R on channels 1 and 3. Alternatively, the controller 112 may reallocate the overall data rate such that data rates of R and 2R are allocated to channels 1 and 3, and the fourth ADC channel having a data rate of R may be used to round-robin poll channels 2 and 4.

Figure 2:
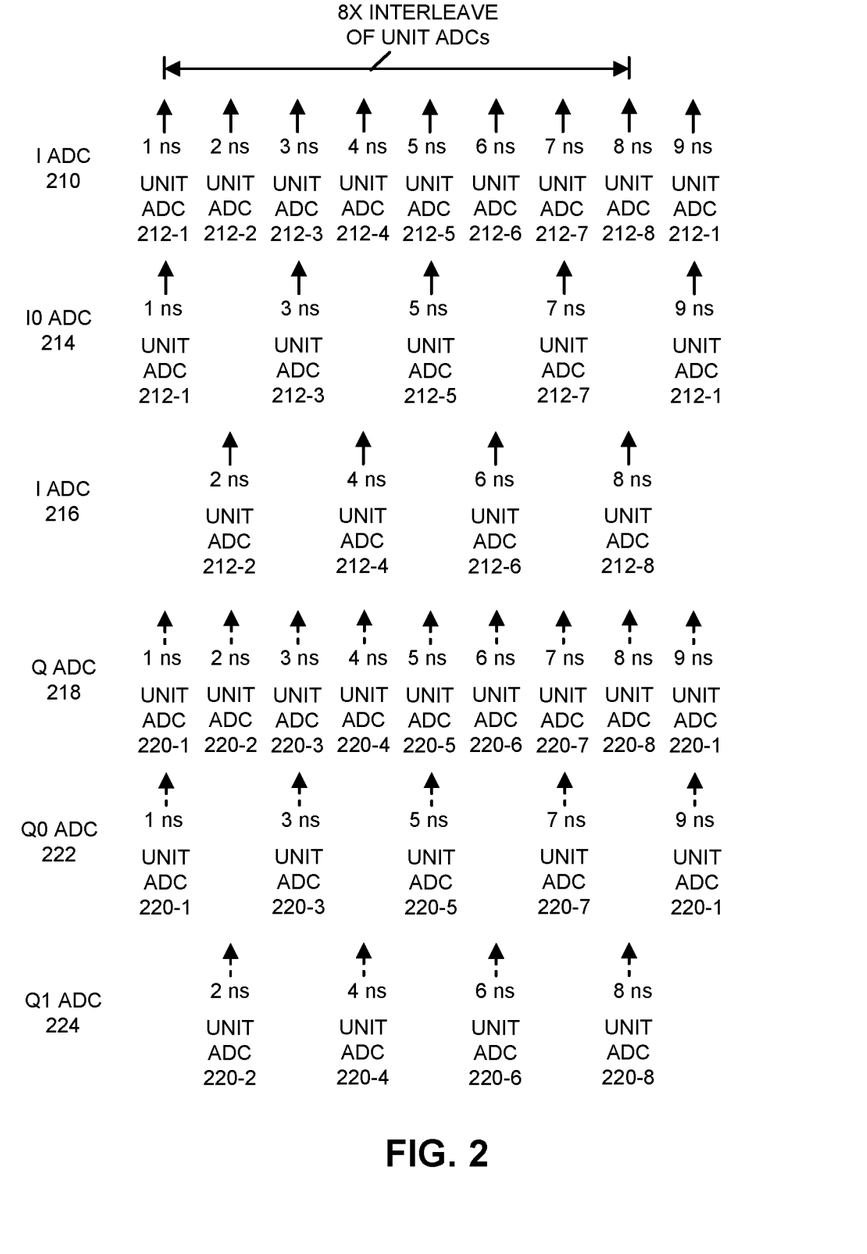
FIG. 2 is a drawing illustrating an example of fixed relative sampling splitting two 1 GS/s unit ADCs into four 500 MS/s unit ADCs in the ADC of FIG. 1 according to some embodiments of the present disclosure.

FIG. 2 presents a drawing illustrating an example of fixed relative sampling splitting two 1 GS/s unit ADCs into four 500 MS/s unit ADCs in the ADC 100. Notably, I ADC 210 is a 1 GS/s ADC that is implemented by time-interleaving N=8 unit ADCs 212, which each have data rates of 125 MS/s. In FIG. 2, the arrows indicate the sampling times of these unit ADCs 212 (with one sample every 8 ns for a given unit ADC). When the N=8 unit ADCs 212 are split into L=2 disjoint subsets, (which are sometimes, respectively, referred to as odd and even subsets), two ADCs each running at 500 MS/s, and which are referred to as I0 ADC 214 and I1 ADC 216 are obtained. These two ADCs can be connected to two independent inputs (such as two different input channels). However, the inputs are no longer simultaneously sampled, because the sampling times or instants of I0 ADC 214 and I1 ADC 216 are separated by a fixed timing offset of 1 ns, as can be seen in FIG. 2.

For the analysis of two independent real-valued signals, such a fixed timing offset is often acceptable, because assuming independence, the initial phases of each real-valued signal at the sampling instances has less influence on the subsequent (downstream) analysis. For example, in a coherent ranging system, only the magnitude of the output spectrum may be required to determine the presence of and the range to a target. Thus, the ability to split a single ADC into L non-simultaneously sampled ADCs may be advantageous to distribute the aggregate data rate among L physical channels.

However, many communication and sensing systems may require quadrature sampling, in which two ADCs are needed to sample the in-phase (I) and quadrature (Q) components. These two components must be simultaneously sampled. Referring again to FIG. 2, two ADCs, which are referred to as the I ADC 210 and a Q ADC 218, can be used to perform this quadrature sampling operation at the original 1 GS/s sampling rate. For example, I ADC 218 is a 1 GS/s ADC that is implemented by time-interleaving N=8 unit ADCs 220, which each have data rates of 125 MS/s. Note that the real part may be represented by the solid arrows in FIG. 2, while the imaginary or out-of-phase part may be represented by the dashed arrows in FIG. 2.

In order to extend this approach to perform quadrature sampling on two independent channels, four ADCs may be required. In a manner similar to how the I ADC 210 was split into L=2 disjoint subsets resulting in the I0 ADC 214 and the I1 ADC 216, the Q ADC 218 may also be split into a Q0 ADC 222 and a Q1 ADC 224. Note that each of the subsets {I0, Q0} and {I1, Q1} forms a pair of simultaneous sampling ADCs that can be used to quadrature sample two independent input channels. Similar to what was discussed previously, the timing offset of 1 ns between these two channels may not be significant in many spectral sensing applications that are insensitive to the initial phase of the signal.

Figure 3A:
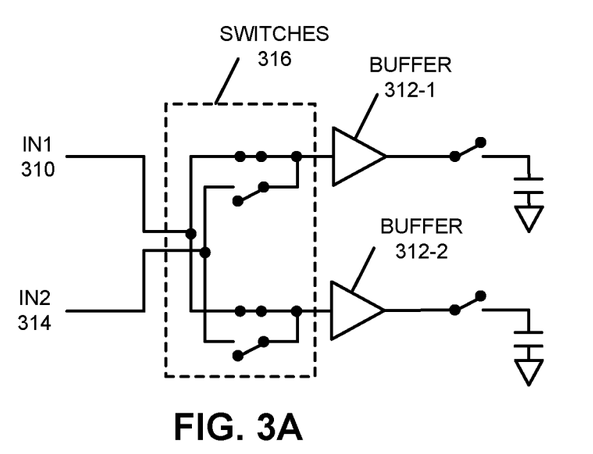
FIG. 3A is a drawing illustrating an example of interleaved and non-interleaved switch configurations in the ADC of FIG. 1 according to some embodiments of the present disclosure.
Figure 3B:
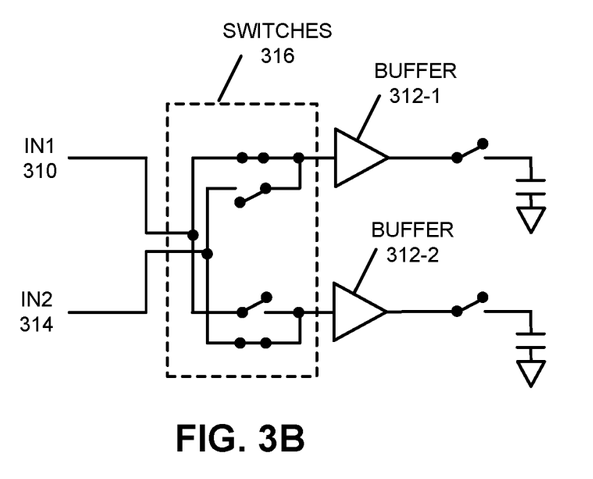
FIG. 3B is a drawing illustrating an example of interleaved and non-interleaved switch configurations in the ADC of FIG. 1 according to some embodiments of the present disclosure.

Thus, without changing the multi-phase clock architecture of the original ADC which is composed of N=8 unit ADCs, the aggregate data rate may be distributed over L=2 independent channels by only reconfiguring the input switch design, but without changing the clocking architecture of the unit ADCs. An example of an input switch design is shown in FIGS. 3A and 3B, which present drawings illustrating examples, respectively of interleaved and non-interleaved switch configurations in the ADC 100. Notably, when time-interleaved, an IN1 signal 310 feeds both buffers 312 and an IN2 signal 314 is disconnected. This configuration may provide a 1 GS/s ADC. Alternatively, when not time-interleaved, the IN1 signal 310 and the IN2 signal 314 may each feed a respective single buffer in buffers 312 and each may be symmetrically loaded with the buffer input and one open switch in switches 316. This configuration may provide two 500 MS/s ADCs.

Note that FIG. 3 illustrates an implementation of a K-throw switch matrix for a small prime numbers K that preserves high-analog bandwidth on the physical input channel even if the data rate is changed, e.g., with reduced or minimal capacitive loading. In some embodiments, more buffers 312 and/or switches 316 can be added in parallel to the architecture shown in FIG. 3.

While the preceding embodiments have practical advantages, they may not allow a single higher data-rate (e.g., 1 GS/s) ADC, which was originally designed for real-valued sampling, to be split into two ADCs to support quadrature sampling, because of sampling time offsets.

Figure 4:
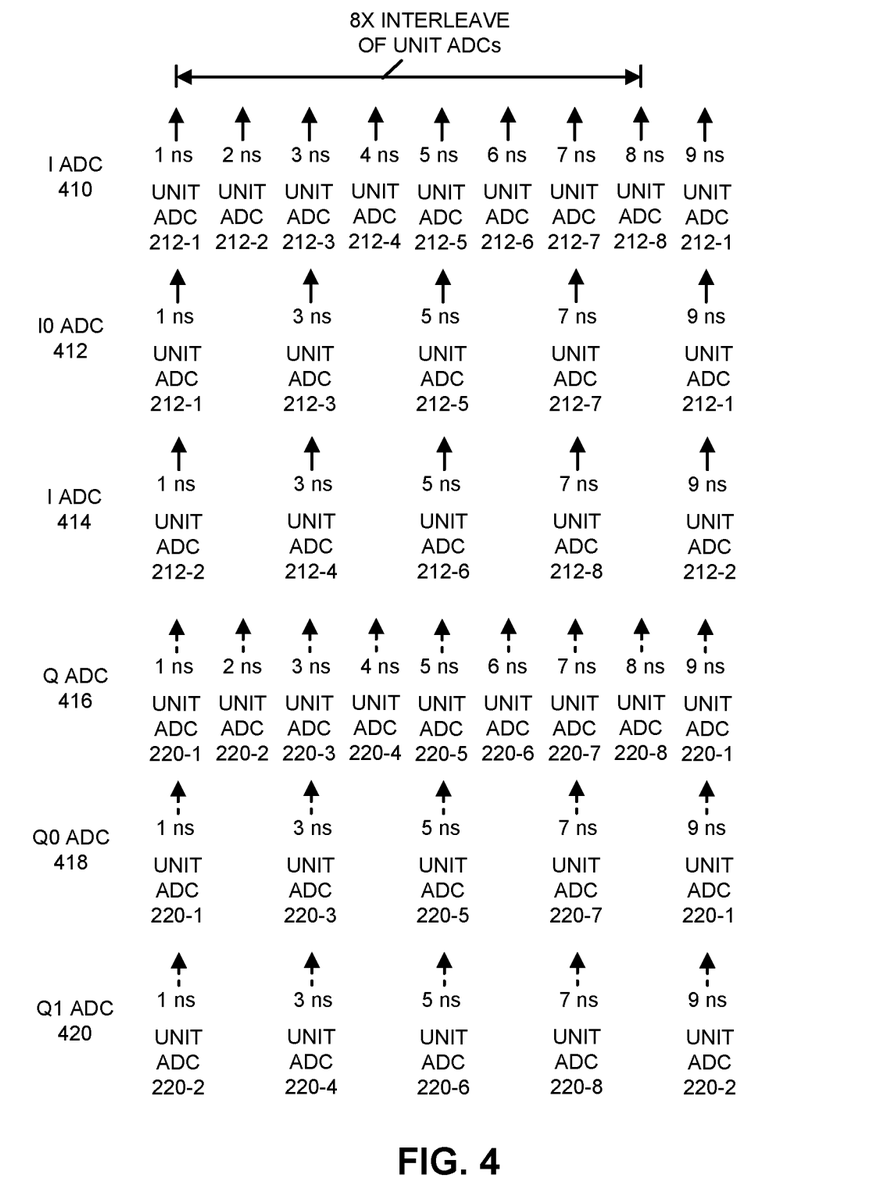
FIG. 4 is a drawing illustrating an example of simultaneous sampling by splitting two 1 GS/s unit ADCs into four 500 MS/s unit ADCs in the ADC of FIG. 1 according to some embodiments of the present disclosure.

FIG. 4 presents a drawing illustrating an example of simultaneous sampling by splitting two 1 GS/s unit ADCs 410 and 416 into four 500 MS/s unit ADCs in the ADC 100. Notably, FIG. 4 illustrates the desired sampling instants for a fully simultaneous sampling approach after the ADC 410 has been split into I0 ADC 412 and I1 ADC 414 (which, respectively, may sample the in-phase components of channel 0 and channel 1). This sampling approach may require changing the clocking architecture in order to apply the same sampling phase clock to the I0 ADC 412 and the I1 ADC 414, respectively. This may also be done for ADC 416, resulting in Q0 ADC 418 and Q1 ADC 420 pair, respectively (which may sample the out-of-phase components of channel 0 and channel 1). Note that all the ADCs may have the same sampling phase clock, which may allow them to be arbitrarily paired together (or placed into a subset with more than two unit ADCs). Thus, an arbitrary pair of samples at a given time from I0 ADC 412, I1 ADC 414, Q0 ADC 418 and Q1 ADC 420 may be simultaneously sampled. This approach may make the design more generalizable, not just for quadrature sampling systems, but for an arbitrary system that has a set of simultaneous sampling ADCs.

As noted previously, the circuit techniques may facilitate unequal data-rate ADCs (as opposed to a 'divide-by-2' approach). Notably, when dividing the time-interleaved ADCs into L disjoint subsets, care may be taken to ensure that the output sample spacing in time of each of the resulting L ADCs is constant. This requirement may be used to design a flexible multi-phase clock generator (such as multi-phase clock generator 116) that divides the set of N unit ADCs into L sub sets.

As indicated, FIG. 2 provides an illustration of an improper assignment. Notably, the assignment of the clock phases to the unit ADCs in the proposed L=2 disjoint subsets cannot simply be {0, 1, 2, 3} and {4, 5, 6, 7}, otherwise the relative sample time spacing between consecutive samples for the first four output samples for each 500 MS/s ADC is 1 ns, but between the 4$^{th}$ and 5$^{th}$ samples the spacing is 5 ns. The goal is to have the output samples equally spaced by, e.g., 2 ns. Consequently, this may be implicitly performed in the embodiment shown in FIG. 2 by choosing the even and odd clock phases to assign to the L=2 disjoint subsets, e.g., {0, 2, 4, 6} and {1, 3, 5, 7}. This approach may preserve equal time spacing in the output stream for each of the L=2 ADCs.

In general, the assignment may be straightforward when an equal power-of-2 number of unit ADCs and clock phases are available, and the allocation of the overall data rate also follows or has a power of 2. For example, the set of unit ADCs in FIG. 2 may be divided into subsets with L=4 unit ADCs, each running at a quarter data rate (250 MS/s) with equally spaced output samples, by choosing the following assignments of clock phases: ADC0: {0, 4}; ADC1: {1, 5}; ADC2: {2, 6}; and ADC3: {3, 7}.

An unequal data-rate allocation into a one-half data-rate ADC at 500 MS/s (e.g., ADCA) and two quarter data-rate ADCs at 250 MS/s (e.g., ADCB and ADCC) may also be possible by assignment of the clock phases as follows: ADCA: {0, 2, 4, 6}; ADCB: {1, 5}; and ADCC: {3, 7}.

In some embodiments, consider the case where the number of available clock phases and the number of unit ADCs are both equal to N, and impose the restriction that each unit ADC receives a unique clock phase and is used in exactly one of the L disjoint subsets. The assignment of the clock phases to unit ADCs (e.g., by the controller 112) may depend on the prime factorization of N, or more precisely on the ability to create a set of reciprocal fractions $x_i/N$ that sum to 1 in a particular way to ensure equal time sampling, where $x_i$ is an integer between 1 and N, inclusive. Note that each fraction that is part of the sum may be reduced to standard form p/q, where p and q are co-prime (e.g., ⅖ is reduced to ⅓). Moreover, two further restrictions may be imposed: (1) p=1 for all reduced fractions, and (2) when the set of denominators {q} is arranged in ascending order, the smallest denominator must be a factor of all the other denominators.

For example, in a system with N=6 unit ADCs fed by a 6-phase clock generator that produces phases numbered 0 to 5, the following data-rate decompositions with equal time spacing may be possible (where 1 is considered the full rate).

Six ADCs, each at one-sixth data rate: 1=⅙+⅙+⅙+⅙+⅙+⅙. In this embodiment, the unit ADC i gets clock phase i, and the smallest denominator six divides all the other denominators (6, 6, 6, 6, 6).

Three ADCs, each at one-third data rate: 1=⅓+⅓+⅓. In this embodiment, the unit ADC i gets the clock phases {i, i+3}, where i=0, 1, 2, and the smallest denominator three divides all the other denominators (3, 3).

Four ADCs, one at one-half data rate and three at one-sixth data rate: 1=½+⅙+⅙+⅙. In these embodiments, the unit ADCs that are part of the one-half data-rate ADC get clock phases {0, 2, 4}, and the one-sixth data-rate unit ADCs get one each of the remaining clock phases {1, 3, 5}. Note that the smallest denominator two divides all the other denominators (6, 6, 6).

Four ADCs, two at one-third data rate and two at one-sixth data rate: 1=⅓+⅓+⅙+⅙. In these embodiments, the unit ADCs that are part of a one-third data-rate ADC i get clock phases {i, i+3}, where i=0, 1, and the one-sixth data-rate ADCs get one each of the remaining clock phases {2, 5}. Note that the smallest denominator three divides all the other denominators (3, 6, 6).

Similarly, in order to illustrate an N=12 unit ADC configuration fed with a 12-phase clock generator in the full data-rate mode, the following assignment may be used. Notably, five ADCs, one at one-half data rate, one at one-quarter data rate, and three at one-twelfth data rate: 1=½+¼+ 1/12+ 1/12+ 1/12. In these embodiments, the unit ADCs that are part of the one-half data-rate ADC get clock phases {0, 2, 4, 6, 8, 10}, the unit ADCs that are part of the one-quarter data-rate ADC get clock phases {1, 5, 9}, and the one-twelfth rate ADCs get one each of the remaining clock phases {3, 7, 11}. Note that the smallest denominator two divides all the other denominators (4, 12, 12, 12).

In some embodiments, the restriction that the number of unit ADCs equals to the number of clock phases in the multi-phase clock generator in order to achieve an arbitrary division of the overall data rate may be removed. This may be reasonable, because the cost (area and power) of a time-interleaved ADCs is typically dominated by the unit ADC design and their number, and not by the multi-phase clock generator. Consequently, it may be advantageous to increase the number of clock phases available in the system without necessarily increasing the number of unit ADCs in order to achieve an arbitrary division of the data rate into L disjoint sub sets.

Figure 5A:
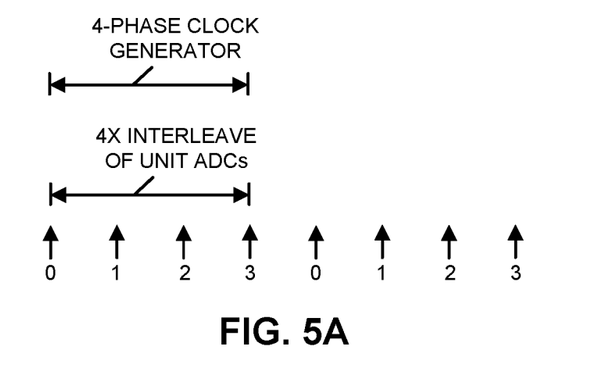
FIG. 5A is a drawing illustrating an example of an equal number of unit ADCs and sampling clock phases for flexible decomposition of the available aggregate data rate while maintaining equal time spacing in the output samples in the ADC of FIG. 1 according to some embodiments of the present disclosure.
Figure 5B:
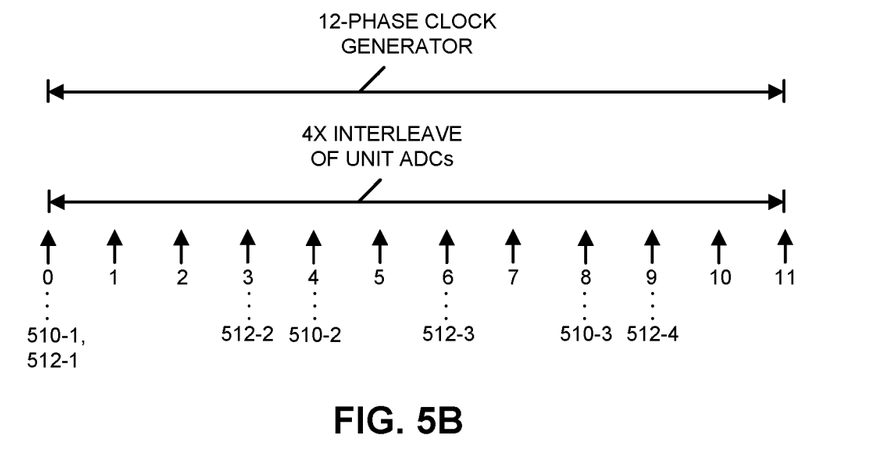
FIG. 5B is a drawing illustrating an example of an unequal number of unit ADCs and sampling clock phases for flexible decomposition of the available aggregate data rate while maintaining equal time spacing in the output samples in the ADC of FIG. 1 according to some embodiments of the present disclosure.

This is illustrated in FIGS. 5A and 5B, which present drawings illustrating examples of an equal and an unequal, respectively, number of unit ADCs and sampling clock phases for flexible decomposition of the available aggregate data rate while maintaining equal time spacing in the output samples in the ADC 100. Notably, as shown in FIG. 5A, consider a case where there is a time-interleaved ADC with a data rate of 1 GS/s composed of four interleaved unit ADCs that each contribute data rates of 250 MS/s. This ADC may be implemented using phase clock generator with four phases. Thus, in this embodiment, the number of clock phases equals the number of unit ADCs. However, in this embodiment, only a power-of-two decomposition of the data rate can be achieved while maintaining equal time spacing in the output samples.

Alternatively, the desired goal may be to create a 750 MS/s ADC and one 250 MS/s ADC, i.e., split the available data rate in a 3:1 ratio, while still maintaining equal spacing among the resulting output samples. This is not possible with a 4-phase clock generator, because the output samples are unequally spaced.

As shown in FIG. 5B, a 12-phase clock generator with the same period can achieve the required equal spacing in the output samples in both modes as follows. In the L=2 unequal split of 750 MS/s/250 MS/s mode, the three unit ADCs included in the 750 MS/s mode ADC use equally separated clock phases {0, 4, 8} (which are labeled as 510-1, 510-2 and 510-3 in FIG. 5B), while any available clock phase can be used for the unit ADCs in the 250 MS/s ADC to create any desired phase offset relationship between the 250 MS/s ADC and the 750 MS/s ADC (e.g., picking one of clock phases {0, 4, 8} will result in simultaneous sampling). For example, the sampling clock phase in the 250 MS/s ADC may be selected based at least in part on the desired relative timing offset. Thus, this phase clock generator facilitates a 3:1 decomposition in the data rate while maintaining equal time spacing in the output samples. Moreover, the same phase clock generator can also support the 1 G/s mode shown in FIG. 5A. Notably, the four unit ADCs may use equally separated clock phases {0, 3, 6, 9}, which are labeled as 512-1, 512-2, 512-3 and 512-4 in FIG. 5B.

Consequently, the number of clock phases required may be the least common multiple of the number of unit ADCs available and the numbers of unit ADCs required in each of the L disjoint subsets, so that the desired data-rate decomposition is achieved.

In the present discussion, a frame may include an image, where the different subsets of the set of unit ADCs receive analog inputs corresponding to different spatial locations or regions. Alternatively, in some embodiments, such as in a scanning system, a frame may be progressively captured over a time interval (such as several milliseconds). Thus, in these embodiments, the subsets of the set of unit ADCs may receive analog inputs corresponding to different spatial locations or regions that are captured at different times.

While the preceding embodiments illustrate ADCs with particular number and type of components (such as the set of N unit ADCs or a number of inputs), in other embodiments there may be more of fewer components, two or more components may be combined, a single component may be implemented using two or more components, and/or there may be different types of components. For example, in the ADC 100, there may be multiple instances of different input signals that are sampled using different or the same dynamic subsets of instances of the set of N unit ADCs. Alternatively or additionally, the positions of input buffers and the switching matrix 120 may be reversed, so that the input buffers are after the switching matrix 120 (instead of before the switching matrix 120, as illustrated in FIG. 1).

Figure 6:
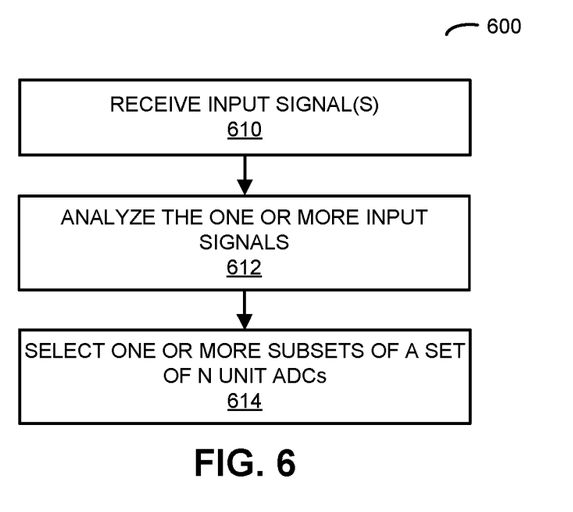
FIG. 6 is a flow diagram illustrating an example of a method for selecting one or more subsets of a set of N unit ADCs using the ADC of FIG. 1 according to some embodiments of the present disclosure.

We now describe embodiments of a method. FIG. 6 presents a flow diagram illustrating an example of a method 600 for selecting one or more subsets of a set of N unit ADCs in an ADC, such as the ADC 100 of FIG. 1. During operation, the ADC may receive one or more input signals (operation 610). Then, the ADC may analyze the one or more input signals (operation 612) to detect a predefined criterion or to determine a predefined characteristic in at least one of the input signals. Next, the ADC may select the one or more subsets of the set of N unit ADCs (operation 614) having different data rates from an aggregate data rate of the set of N unit ADCs. Note that a given data rate of a given subset may include a variable data rate that corresponds to an integer multiple of an inverse of N times the aggregate data rate.

In some embodiments of the method 600, there may be additional or fewer operations. Moreover, the order of the operations may be changed, and/or two or more operations may be combined into a single operation.

The disclosed ADCs and the circuit techniques can be (or can be included in) any electronic device. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the ADCs, in alternative embodiments, different components and/or subsystems may be present in the ADCs. Thus, the embodiments of the ADCs may include fewer components, additional components, different components, two or more components may be combined into a single component, a single component may be separated into two or more components, and/or one or more positions of one or more components may be changed.

Moreover, the circuits and components in the embodiments of the ADCs may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

An integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An analog-to-digital converter (ADC), comprising:
a set of N unit ADCs, wherein a given ADC in the set of N unit ADCs has a common architecture, and the set of N unit ADCs is configured to provide an aggregate data rate; and
control logic coupled to the set of N unit ADCs, wherein the control logic is configured to:
select subsets of the set of N unit ADCs having different data rates from the aggregate data rate, wherein a given data rate of a given subset comprises a variable data rate that corresponds to an integer multiple of an inverse of N times the aggregate data rate.

2. The ADC of claim 1, wherein the set of N unit ADCs comprises time-interleaved ADCs.

3. The ADC of claim 1, wherein the subsets have common sampling times.

4. The ADC of claim 1, wherein the control logic is configured to dynamically select the subsets.

5. The ADC of claim 1, wherein the control logic is configured to dynamically select the subsets on a frame-by-frame basis.

6. The ADC of claim 1, wherein the control logic is configured to dynamically select the subsets based at least in part on at least a portion of a frame that is identified as meeting a predefined criterion or having a predefined characteristic.

7. The ADC of claim 1, wherein the control logic is configured to dynamically select the subsets at a boot time or a runtime of the ADC.

8. The ADC of claim 1, wherein the ADC comprises a multi-phase clock having phases corresponding to a number of possible subsets;
wherein the given subset uses one or more of the phases of the multi-phase clock; and
wherein the selected subsets do not use all of the phases.

9. The ADC of claim 8, wherein the control logic is configured to select the one or more of the phases for the given subset.

10. The ADC of claim 8, wherein a number of phases is greater than a number of ADCs in the set of N unit ADCs.

11. The ADC of claim 10, wherein the number of phases is a least common multiple of the number of ADCs in the set of N unit ADCs and numbers of ADCs in each of the subsets.

12. The ADC of claim 1, wherein the subsets comprise different numbers of ADCs and at least two of the subsets have different data rates from each other.

13. The ADC of claim 1, wherein, while the subsets have arbitrary numbers of ADCs, the control logic uses predefined assignments of ADCs to the subsets.

14. The ADC of claim 13, wherein the predefined assignments are based at least in part on desired sampling times of the subsets.

15. The ADC of claim 1, wherein the subsets have different sampling times.

16. The ADC of claim 1, wherein the given subset comprises ADCs that are configured to perform quadrature measurements of an input signal using common sampling times that are equally spaced from each other.

17. An electronic device, comprising an analog-to-digital converter (ADC), wherein the ADC comprises:
a set of N unit ADCs, wherein a given ADC in the set of N unit ADCs has a common architecture, and the set of N unit ADCs is configured to provide an aggregate data rate; and
control logic coupled to the set of N unit ADCs, wherein the control logic is configured to:
select subsets of the set of N unit ADCs having different data rates from the aggregate data rate, wherein a given data rate of a given subset comprises a variable data rate that corresponds to an integer multiple of an inverse of N times the aggregate data rate.

18. The electronic device of claim 17, wherein the control logic is configured to dynamically select the subsets.

19. A method for selecting one or more subsets of a set of N unit analog-to-digital converters (ADCs), comprising:
an ADC that includes the set of N unit ADCs:
receiving input signals;
analyzing the input signals to detect a predefined criterion or to determine a predefined characteristic in at least one of the input signals; and
selecting the one or more subsets of the set of N unit ADCs having different data rates from an aggregate data rate of the set of N unit ADCs, wherein a given data rate of a given subset comprises a variable data rate that corresponds to an integer multiple of an inverse of N times the aggregate data rate.

20. The method of claim 19, wherein the set of N unit ADCs comprises time-interleaved ADCs.

\* \* \* \* \*